United States Patent [19]

Frass et al.

[11] Patent Number: 4,725,526

[45] Date of Patent: Feb. 16, 1988

[54] PROCESS FOR REDUCING HALATIONS USING LUBRICANT IN THE COURSE OF IRRADIATING AND DEVELOPING REPRODUCTION LAYERS USED FOR PREPARING PRINTING PLATES

[75] Inventors: Werner Frass; Engelbert Pliefke, both of Wiesbaden, Fed. Rep. of Germany

[73] Assignee: Hoeschst Aktiengesellschaft, Fed. Rep. of Germany

[21] Appl. No.: 766,691

[22] Filed: Aug. 19, 1985

[30] Foreign Application Priority Data

Aug. 21, 1984 [DE] Fed. Rep. of Germany ....... 3430712

[51] Int. Cl.$^4$ .......................... G03F 7/08; G03F 7/10; G03F 7/00
[52] U.S. Cl. .................................. 430/300; 430/141; 430/142; 430/162; 430/166; 430/169; 430/191; 430/192; 430/271; 430/272; 430/302; 430/950
[58] Field of Search ............... 430/141, 142, 302, 166, 430/191, 192, 169, 162, 270, 271, 272, 300, 950, 309

[56] References Cited

U.S. PATENT DOCUMENTS

| | | | |
|---|---|---|---|
| 3,203,805 | 8/1965 | Burg | 96/115 |
| 3,653,903 | 4/1972 | Nihyakumen et al. | 430/142 |
| 3,779,774 | 12/1973 | Cope et al. | 430/192 |
| 4,036,644 | 7/1977 | Kaplan et al. | 430/191 |
| 4,047,958 | 9/1977 | Yoneyama et al. | 430/527 |
| 4,168,979 | 9/1979 | Okishi et al. | 96/75 |
| 4,199,649 | 4/1980 | Yundt | 428/411 |
| 4,336,319 | 6/1982 | Nagashima et al. | 430/192 |
| 4,377,631 | 3/1983 | Toukhy et al. | 430/191 |
| 4,510,227 | 4/1985 | Mohr et al. | 430/175 |
| 4,560,636 | 12/1985 | Stahlhofen | 430/191 |

FOREIGN PATENT DOCUMENTS

| | | |
|---|---|---|
| 1148014 | 6/1983 | Canada . |
| 0068599 | 1/1983 | European Pat. Off. . |
| 1339663 | 12/1973 | United Kingdom . |
| 1442368 | 7/1976 | United Kingdom ................ 430/303 |

OTHER PUBLICATIONS

D. L. Flowers, *Lubrication in Photolithography*, J. Electrochem Soc., Solid State Science & Tech., vol. 124, No. 10, pp. 1608–1612, 10/1977.
D. L. Flowers & J. N. Smith, *Lubrication and Pattern Improvement in Photolithography*, J. Electrochem. Soc. Solid State Science & Tech., vol. 126, No. 7, pp. 1579–1582, 7/1980.
IBM Tech. Discl. Bulletin, *Protective Coatings for Photomask*, Sep. 1970, vol. 13, No. 4, p. 893.
IBM Tech. Discl. Bulletin, *Photographic Plates*, "Photographic Plates", C. B., Humphreys, Apr. 1970, vol. 12, No. 11, p. 1765.
Hitoshi Touma, "Image Bearing Material", JP-A-57,165,848, vol. 7, No. 6, (P-167), Jan. 11, 1983.
IBM Tech. Disclosure Bulletin, "Release Agent Method for Artwork Glass", J. T. Gibney, vol. 18, No. 10, Mar. 1976, p. 3379.

*Primary Examiner*—Charles L. Bowers, Jr.
*Attorney, Agent, or Firm*—Schwartz Jeffery Schwaab Mack Blumenthal & Evans

[57] ABSTRACT

In a process for reducing halations during the imagewise irradiation of a reproduction layer exposed through a planar image original, at least one lubricant either is contained in the layer or is interposed between the layer and the image original. Suitable lubricants include organic polysiloxanes, hydrocarbon polymers, polyaryl esters, and alkanoic acids or alkenoic acids having at least 9 carbon atoms. Excluded are lubricants comprising copolymers of dimethyl dichlorosilane, ethylene oxide and propylene oxide, provided they are located in the reproduction layer.

8 Claims, No Drawings

PROCESS FOR REDUCING HALATIONS USING LUBRICANT IN THE COURSE OF IRRADIATING AND DEVELOPING REPRODUCTION LAYERS USED FOR PREPARING PRINTING PLATES

BACKGROUND OF THE INVENTION

The present invention relates to a process for reducing halations in an irradiated reproduction layer by adding an auxiliary agent to the reproduction layer.

A support material for offset printing plates is provided, either directly by the user or by the manufacturer of precoated printing plates, with a radiation-sensitive layer (reproduction layer) on one or both sides of the support material, with the aid of which layer a printable image of an original is produced by photomechanical means. After the production of a printing form from the printing plate, the support carries the image areas which are ink receptive in the subsequent printing and, at the same time, forms the hydrophilic image background for the lithographic printing process in the areas which are image-free (non-image areas) during subsequent printing.

It is technically feasible to use foils of aluminum, steel, copper, brass or zinc and also plastic films or paper as the base materials for supports of this kind. These raw materials are converted into supports of offset printing plates by appropriate modifying treatments, for example, graining, dull chromium plating, superficial oxidation and/or application of an intermediate layer. Aluminum, which is presently the most widely used base material for offset printing plates, is superficially roughened according to known methods, e.g., by dry brushing, slurry brushing, sandblasting, chemically and/or electrochemically treating. To increase resistance to abrasion, the roughened substrate can additionally be subjected to an anodization, in which a thin oxide layer is formed on the substrate.

The printing plate support coated with a radiation-sensitive layer must meet additional requirements, some of which are correlated with the requirements demanded of the support material itself. These requirements include, for example, high radiation sensitivity (photosensitivity), good developability, clear contrast after exposure and/or development, large print runs and a reproduction which is, as closely as possible, true to the original. In this connection, the ability of a radiation-sensitive layer to remain substantially free of halation (i.e., the lateral and oblique spreading of radiation through the layer) upon irradiation (exposure) of the printing plate also gains increasing importance, particularly in printing plates provided with positive-working radiation-sensitive layers. From the prior art, the following publications are, for example, known that describe attempts to solve the halation problem.

In German Offenlegungsschrift No. 25 12 043 (corresponding to U.S. Pat. No. 4,168,979), a radiation-sensitive printing plate is described in which the surface of the radiation-sensitive layer is coated with a matt layer that is removed by developing the exposed plate. This matt layer usually is a binder layer (e.g., comprising a cellulose ether), having matting particles, such as particles of $SiO_2$, $ZnO$, $TiO_2$, $ZrO_2$, glass, $Al_2O_3$, starch or polymers dispersed therein. It is stated that a printing plate built up in this manner reduces the period of time required to attain a largely complete and uniform contact between the film original and the radiation-sensitive layer during the exposure step of the platemaking process.

German Offenlegungsschrift No. 29 26 236 (corresponding to Canadian Pat. No. 1,148,014) discloses a radiation-sensitive reproduction material. The positive-working radiation-sensitive layer of this material contains particles, corresponding to the matting particles disclosed in the above-mentioned German Offenlegungsschrift No. 25 12 043, the smallest dimension of which particles is at least equal to the thickness of the layer itself. This type of material is intended for any application in which positive contact copies must be made in a vacuum copying frame and in which it is important to obtain a high image resolution and a true reproduction of the original. In particular, it is stated that the material shows a reduced halation tendency in the copying procedure. Halation may occur during irradiation due to a locally increased distance between the original and the light-sensitive layer, resulting in an imprecise reproduction of small image elements, such as screen dots.

Applying particles to the radiation-sensitive layer, together with a binder, or incorporating particles in the layer without any special binder is, however, an expensive process step which requires a great deal of care, particularly in modern, continuously-operating coating lines. Moreover, in developing the layer the particles which have been applied or added to the layer form a sort of "foreign matter" in the developing liquid and, particularly, in the automatically working developing apparatus as well, leading to interference with the functioning of the apparatus.

Published European Patent Application No. 42,104 (corresponding to U.S. Pat. No. 4,510,227) discloses adding surface-active polysiloxanes to reproduction layers in order to achieve a more uniform coating. The polysiloxanes used contain dialkyl siloxane units as well as alkylene oxide units. Although an effect of such additions on the halation behavior of the reproduction layers is mentioned, it is not specified in detail.

SUMMARY OF THE INVENTION

It is therefore an object of the present invention to provide a method for reducing the halation tendency of an irradiated reproduction layer, which method requires the smallest possible number of additional process steps but does not entail negative effects, even upon further processing of the layer.

It is also an object of the present invention to provide copying material characterized by reduced halations when the reproduction layer of the copying material is irradiated.

In accomplishing the foregoing objects, there has been provided, in accordance with one aspect of the present invention, a copying material comprising a substrate and a radiation-sensitive reproduction layer applied to the substrate, the reproduction layer comprising at least one substance from the group consisting of lubricants exclusive of copolymers comprised of dimethyl dichlorosilane, ethylene oxide and propylene oxide. In accordance with another aspect of the present invention, there has been provided copying material comprising a substrate, a radiation-sensitive reproduction layer applied thereto, and a coating, applied to the reproduction layer, which comprises at least one of the aforesaid lubricant substances.

There has also been provided, in accordance with another aspect of the present invention, a method for reducing halations in imagewise irradiated copying material comprising a substrate and a radiation-sensitive reproduction layer applied to the substrate, which method comprises the step of interposing between the reproduction layer and an image original a coating comprised of at least one lubricant, the step being carried out prior to irradiation of the reproduction layer through the image original. In one preferred embodiment, the aforesaid coating comprised of lubricant substance is applied to the reproduction layer, while in another preferred embodiment the coating is applied to the image original.

There has also been provided, in accordance with yet another aspect of the present invention, a halation-reducing method comprising the step of incorporating into a substrate-supported, radiation-sensitive reproduction layer at least one substance from the group consisting of lubricants exclusive of copolymers comprised of dimethyl dichlorosilane, ethylene oxide and propylene oxide, the step being carried out prior to irradiation of the reproduction layer through an image original.

Other objects, features, and advantages of the present invention will become apparent from the following detailed description. It should be understood, however, that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

In the present invention, halation in the course of imagewise irradiation, through a planar image original, of the photosensitive layer(s) of a printing plate is reduced by adding an auxiliary agent to the photosensitive material with which the planar substrate material of the printing plate is coated; or, alternatively, by interposing the auxiliary agent between the photosensitive layer and the image original. The process of the present invention is characterized in that at least one lubricant is used as the auxiliary agent, excluding copolymers of dimethyl dichlorosilane, ethylene oxide and propylene oxide, provided these are located within the photosensitive layer.

In this description, the term "lubricants" is understood to denote customary lacquer additives that are known to improve the non-sticking characteristics of lacquers or lacquer-type systems. Lubricants that are suitable for use in the process of the present invention include, in particular, polymeric organic compounds, such as organic polysiloxanes in the form of either a silicone oil or a mixture of a silicone oil and a silicone resin or silicone rubber, the preferably used compound being (1) a homopolymer comprising dimethyl siloxane units or (2) a copolymer comprising alkylene oxide units (ethylene oxide and/or propylene oxide units) and dimethyl siloxane units. Suitable polymeric organic compounds further include polysiloxane-containing or polysiloxane-free hydrocarbon polymers or polyaryl esters. In lieu of, or in addition to, the above-mentioned polymeric organic compounds, alkanoic acids and alkenoic acids having at least 9 carbon atoms, which may be saturated or unsaturated, can also be used in the process of the present invention. Examples of such acids include undecanoic acid, octadec-9-enoic acid (oelic acid) and octadecanoic acid (stearic acid).

The lubricants can be used in the present invention either individually or in mixtures. Suitable lubricants generally have an oil-like or wax-like consistency. Excluded from the class of lubricant compounds suitable for use in the present invention are the copolymers of dimethyl dichlorosilane, ethylene oxide and propylene oxide, which are used in the reproduction layer in Examples 2 and 4 of the abovementioned published European Patent Application No. 42,104 and which are said in the published application to produce a reduction in halation tendency that is not, however, quantified.

The following silicone oils or silicone oil-containing products are exemplary of commercial products that are, in particular, marketed as lubricants in the field of lacquers and that are suitable for use in the present invention: Additol XL 122 ® (manufactured by Hoechst AG, Frankfurt-Hoechst, Federal Republic of Germany); Nopco LA 157 ®, Nopco LA 114 ®, Nopco LA 111 ® (manufactured by Diamond Shamrock, U.S.A.); silicone oils AR 200 and AL (manufactured by Wacker-Chemie GmbH, Munich, Federal Republic of Germany); Baysilon A ® (manufactured by Bayer AG, Leverkusen, Federal Republic of Germany); and Tegopren 100 ® (manufactured by Th. Goldschmidt AG, Essen, Federal Republic of Germany); and the silicone oil-free polymers Forbest 62b ® and Forbest 150 ® (distributed by Lucas Meyer, Hamburg, Federal Republic of Germany).

It may be that the reduction of halation tendency achieved with the present invention is caused by a decrease in the static friction between the planar image original (film original) and the reproduction layer. Such a decrease would contrast sharply with the prior art, which generally involved increasing the contact roughness between image original and reproduction layer.

The process of the present invention can, in particular, be practiced using the following variations:

A: At least one lubricant is added to the coating solution used to prepare the reproduction layer.

B: At least one lubricant, preferably in a dilute solution or dispersion, is applied to the reproduction layer prior to irradiating, and the solvent or dispersing agent is then removed.

C: At least one lubricant, preferably in a dilute solution or dispersion, is applied, before irradiating, to the surface of the planar image original to be placed in contact with the reproduction layer, and the solvent or dispersing agent is then removed.

When variant A is employed, care has to be taken to avoid adverse effects on subsequent processing (developing, gumming, printing) of the printing plate or printing form, respectively, caused by the addition of the lubricant. One difficulty occasionally resulting from the use of silicone oil-containing products is a reduced wetting of the reproduction layer by the usually aqueous developing solution. This effect can be compensated for by adding alkanoic acids or, generally, by employing silicone oil-free products.

By means of combinations of lubricants, the halation behavior of conventional reproduction layers can be improved even further, following the present invention. For variant A, the concentration of the lubricant(s) in the reproduction layer, after application and drying, can be in the range from about 0.05% to 5%, preferably from about 0.1% to 3%, based on the sum of the components of the reproduction layer.

When variants B and C are used, coating of the lubricant onto the reproduction layer or the image original, respectively, should be effected uniformly and, particularly in the application from a solution or dispersion, without streaks, since otherwise an adverse result may occur during irradiation. In accordance with the present invention, the concentration of the lubricant(s) in solution or dispersion can be in the range from about 0.05% to 10%, preferably from about 0.08% to 8%. Based on the weight of the reproduction layer or the image original, respectively, the proportion of the lubricant(s), after removing the solvent or dispersing agent, is generally in the range from 0.001% to 1%. Nevertheless, deviation from these values, particularly towards higher values, can also be made.

Suitable solvents or dispersing agents include, in particular, low-boiling hydrocarbons, such as gasoline fractions (usually ranging from pentanes to decanes). It is also possible to use glycol derivatives like ethylene glycol monoethers, dimethyl formamide, and chlorinated hydrocarbons, such as dichloroethane and optionally, in admixture with the above-mentioned compounds, ketones, such as butanone, glycol ether esters and cyclic ethers, such as tetrahydrofuran, which may, however, give rise to slight swelling or incipient dissolving of the reproduction layer.

In printing plates, the reproduction layers are present as coatings on at least one surface of a support material. Suitable base materials for the support material include, in addition to the materials which have already been mentioned above, particularly those comprising aluminum or one of its alloys that contain, for example, more than 98.5% by weight of Al and proportions of Si, Fe, Ti, Cu and Zn. For the production of support materials for printing plates, the planar aluminum is, after optional precleansing, first roughened mechanically (for example, by brushing and/or by treatment with abrasives), chemically (for example, by means of etching agents) and/or electrochemically (for example, by treatment with a.c. current in aqueous acid or salt solutions). Electrochemical roughening is preferably carried out in aqueous solutions based on HCl and/or HNO$_3$. Before the electrochemical treatment step, these aluminum support materials can also be mechanically roughened (for example, by brushing with wire brushes or nylon brushes and/or by treating with an abrasive agent). All process steps can be carried out batchwise, using plates or foils, but they are preferably carried out continuously, using webs.

Precleaning of the preferably used aluminum materials comprises, for example, treatment with an aqueous NaOH solution, with or without degreasing agents and/or complex formers, trichloroethylene, acetone, methanol or other commercial so-called aluminum pickles. The roughening step can be followed by an additional etching treatment such that, in particular, a maximum of 2 g/cm$^2$ is removed. If there are several roughening steps, an etching treatment can also be carried out between the individual steps, with up to 5 g/cm$^2$ being removed between the steps. The etching solutions used are in general aqueous alkali metal hydroxide solutions, aqueous solutions of alkaline-reacting salts or aqueous acid solutions based on HNO$_3$, H$_2$SO$_4$ or H$_3$PO$_4$. In addition to an etching treatment step between the roughening step and a following anodization step, non-electrochemical treatments are also known, which substantially have a rinsing and/or cleaning action and are useful, for example, for removing deposits ("smut") formed during the roughening process or for removing residual electrolyte. For example, dilute aqueous alkali metal hydroxide solutions or water are used for these purposes.

The roughening process, electrochemical or otherwise, is usually followed by an anodic oxidation of the aluminum in a further process step, in order to improve, for example, the abrasion and adhesion properties of the surface of the support material. Conventional electrolytes, such as H$_2$SO$_4$, H$_3$PO$_4$, H$_2$C$_2$O$_4$, amidosulfonic acid, sulfosuccinic acid, sulfosalicylic acid, and mixtures thereof, may be used for the anodic oxidation; particular preference is given to H$_2$SO$_4$ and H$_3$PO$_4$, which may be used alone or in a mixture and/or in a multi-step anodizing process. An aqueous solution containing H$_2$SO$_4$ and Al$^{3+}$ ions is particularly preferably used. The oxide layer weights obtained in the process are, in particular, in the range between about 1 and 8 g/m$^2$ (corresponding to layer thicknesses from about 0.3 to 2.5 μm).

The materials prepared in this manner are used as supports for offset printing plates, i.e., one or both surfaces of the support material are coated with a radiation-sensitive composition, either by the manufacturers of presensitized printing plates or directly by the users. Suitable radiation-sensitive (photosensitive) layers basically include any layers which after irradiation (exposure), optionally followed by development and/or fixing, yield a surface in imagewise configuration which can be used for printing. As a rule, irradiation (exposure) is carried out in a copying frame, e.g., where a planar image original (film original) is placed in intimate contact with the reproduction layer by evacuating the copying frame (vacuum copying frame).

Apart from the silver halide-containing layers used for many applications, various other layers are known which are described, for example, in "Light-Sensitive Systems" by Jaromir Kosar, published by John Wiley & Sons, New York, 1965: colloid layers containing chromates and dichromates (Kosar, Chapter 2); layers containing unsaturated compounds, in which, upon exposure, these compounds are isomerized, rearranged, cyclized, or crosslinked (Kosar, Chapter 4); layers containing compounds that can be photopolymerized, in which, upon exposure, monomers or prepolymers undergo polymerization, optionally with the aid of an initiator (Kosar, Chapter 5); and layers containing o-diazoquinones, or condensation products of diazonium salts (Kosar, Chapter 7). The layers that are suitable also include electrophotographic layers, i.e., layers that contain an inorganic or organic photoconductor. In addition to the photosensitive substances, these layers can also contain other constituents, such as resins, dyes and plasticizers. In particular, the following photosensitive compositions or compounds can be employed in the coating of the support materials prepared in accordance with the present invention:

Positive-working reproduction layers that contain, as the light-sensitive compounds, o-quinone diazides, preferably o-naphthoquinone diazides, such as high or low molecular-weight naphthoquinone-(1,2)-diazide-(2)-sulfonic acid esters or amides, as described, for example, in German Pat. Nos. 854,890, 865,109, 879,203, 894,959, 938,233, 1,109,521, 1,144,705, 1,118,606, 1,120,273, 1,124,817 and 2,331,377; and in European Patent Application Nos. 21,428 and 55,814.

Negative-working reproduction layers that contain condensation products from aromatic diazonium salts and compounds with active carbonyl groups, preferably condensation products formed from diphenylaminediazonium salts and formaldehyde, which are described, for example, in German Pat. Nos. 596,731, 1,138,399, 1,138,400, 1,138,401, 1,142,871 and 1,154,123, in U.S. Pat. Nos. 2,679,498 and 3,050,502; and in British Pat. No. 712,606.

Negative-working reproduction layers that contain co-condensation products of aromatic diazonium compounds, such as are described, for example, in German Pat. No. 2,065,732, comprising products possessing at least one unit each of (a) an aromatic diazonium salt compound that is able to participate in a condensation reaction and (b) a compound that is able to participate in a condensation reaction, such as a phenol ether or an aromatic thioether, the aforesaid units (a) and (b) being connected by a bivalent linking member, such as a methylene group, derived from a carbonyl compound which is capable of participating in a condensation reaction.

Positive-working layers according to German Offenlegungsschriften No. 26 10 842 and No. 29 28 636, and in German Pat. No. 27 18 254, which layers contain (1) a compound that, on being irradiated, splits off an acid, (2) a monomeric or polymeric compound that possesses at least one C—O—C group which can be split off by acid (e.g., an orthocarboxylic acid ester group or a carboxylic acid amide acetal group), and, if appropriate, (3) a binder.

Negative-working layers comprised of photopolymerizable monomers, photoinitiators, binders, and, if appropriate, further additives.

In these layers, for example, acrylic and methacrylic acid esters, or reaction products of diisocyanates with partial esters of polyhydric alcohols, are employed as monomers, as described, for example, in U.S. Pat. Nos. 2,760,863 and 3,060,023, and in German Offenlegungsschriften Nos. 20 64 079 and 23 61 041.

Negative-working layers according to German Offenlegungsschrift No. 30 36 077, which layers contain, as the photosensitive compound, a diazonium salt polycondensation product or an organic azido compound, and, as the binder, a high-molecular weight polymer with alkenylsulfonylurethane or cycloalkenylsulfonylurethane side groups.

It is also possible to apply photosemiconducting layers to the support materials prepared in accordance with the present invention, such as described, for example, in German Pat. Nos. 11 17 391, 15 22 497, 15 72 312, 23 22 046 and 23 22 047, as a result of which highly photosensitive electrophotographic printing plates are obtained.

The process of the present invention can be carried out in such a way that the above-described problems encountered by the prior art in the production and processing of reproduction layers on printing plates are obviated. The process results in a marked reduction of halations.

In the foregoing description and in the examples which follow, percentages invariably refer to weight percent, unless otherwise stated. Parts by weight are related to parts by volume as g is related to $cm^3$. In addition, the following methods were used in the examples for the determination of certain characterizing parameters.

Exposure time refers to the period of time which is, in each case, required to make cut edges disappear by exposure. In the determination of the "slip angle", the printing plate or the image original, respectively, are lifted stepwise to form an inclined plane. When the angle formed with the horizontal is sufficiently great, a test weight placed on the reproduction layer or the treated surface, respectively, slides down the incline. The following tables indicate the minimum angles required for the test weight, which has been set in motion, to travel through the test distance without slowing down. The halation tendency is visually determined and classified from very strong (— —), through —, 0—, 0, 0+ and +, to minimal (+ +).

TABLE I

| Example | Lubricant Type | Concentration (%)* | Exposure Time (sec) | Slip Angle (°) | Halation |
|---|---|---|---|---|---|
| C1 | — | — | 100 | 30 | — |
| 1 | L1 | 1.00 | 90 | 24 | 0 |
| 2 | L2 | 0.75 | 130 | 16 | + |
| 3 | L2 | 0.75 | 100 | 14 | ++ |
|   | L1 | 0.50 |     |    |    |
| 4 | L3 | 1.00 | 160 | 15 | ++ |
| 5 | L4 | 1.00 | 130 | 10 | ++ |
| 6 | L4 | 1.00 | 120 | 6 | ++ |
|   | L1 | 1.00 |     |    |    |
| 7 | L2 | 0.25 | 110 | 26 | 0 |
| 8 | L2 | 1.00 | 150 | 10 | ++ |
| 9 | L5 | 1.00 | 140 | 13 | ++ |
| 10 | L5 | 1.00 | 100 | 9 | ++ |
|    | L1 | 1.00 |     |   |    |
| 11 | L2 | 0.25 | 100 | 17 | ++ |
|    | L1 | 0.75 |     |    |    |
| 12 | L2 | 0.25 | 110 | 20 | + |
|    | L8 | 0.75 |     |    |    |

TABLE II

| Example | Lubricant Type | Concentration (%)* | Exposure Time (sec) | Slip Angle (°) | Halation |
|---|---|---|---|---|---|
| C2 | — | — | 100 | 28 | — |
| 13 | L2 | 1.00 | 120 | 9 | + |
| 14 | L2 | 5.00 | 130 | 6 | ++ |
| 15 | L6 | 1.00 | 130 | 12 | 0+ |
| 16 | L2 | 2.50 | 100 | 12 | ++ |
|    | L9 | 2.50 |     |    |    |
| 17 | L2 | 3.75 | 100 | 10 | ++ |
|    | L1 | 1.25 |     |    |    |
| 18 | L7 | 1.00 | 110 | 14 | + |

*based on the applied solution or dispersion, respectively

TABLE III

| Example | Lubricant Type | Concentration (%)* | Exposure Time (sec) | Slip Angle (°) | Halation |
|---|---|---|---|---|---|
| C3 | — | — | 100 | 23 | — |
| 19 | L10 | 0.1 | 100 | 10 | + |
| 20 | L11 | 1.0 | 100 | 11 | 0+ |
| 21 | L12 | 0.1 | 100 | 11 | ++ |
| 22 | L13 | 0.1 | 100 | 11 | ++ |
| 23 | L2 | 1.0 | 100 | 11 | + |
| 24 | L14 | 1.0 | 100 | 12 | + |
| C4 | — | — | 40 | 23 | — |
| 25 | L14 | 1.0 | 40 | 12 | + |

*based on the applied solution or dispersion, respectively

The radiation-sensitive layer that was applied to the support material comprised either (A) a negative-working layer (Example 25 and Comparative Example C4) containing a reaction product of polyvinyl butyral with propenyl sulfonyl isocyanate, 2,6-bis-(4-azidobenzene)-4-methyl-cyclohexanone, Rhodamine 6 GDN Extra ® and 2-benzoyl-methylene-1-methyl-β-naphthothiazoline in ethylene glycol monomethyl ether and tetrahydrofuran (solids content about 29.5 parts by weight in 150 parts by volume of solvent); or (B) a positive-working layer (Examples 1 to 24 and Comparative Examples C1 to C3) containing a cresolformaldehyde novolak; a naphthoquinone diazide sulfonic acid ester prepared from naphthoquinone-(1,2)-diazide-(2)-sulfonic acid chloride-(5), a cresol-formaldehyde novolak and 2,3,4-trihydroxybenzophenone in the presence of a base; and naphthoquinone-(1,2)-diazide-(2)-sulfonic acid chloride-(4) and crystal violet in tetrahydrofuran, ethylene glycol monomethyl ether and butyl acetate (solids content about 2.2 parts by weight in 90 parts by volume of solvent). Useful printing plates and printing forms can be prepared using the radiation-sensitive layers described above.

The following lubricants (L) were used in the examples:

L 1: oleic acid
L 2: silicone oil with a content of silicone rubber (Additol XL 122 ®)
L 3: hydrocarbon polymer that is free from silicone oil and mineral oil (Forbest 62b ®)
L 4: copolymer of ethylene glycol and dimethyl siloxane (Nopco LA 157 ®)
L 5: polyaryl ester that is free from resin and silicone (Forbest 150 ®)
L 6: silicone oil ("AR 200")
L 7: silicone oil (Nopco LA 114 ®)
L 8: stearic acid
L 9: chloroparaffin
L 10: polydimethyl siloxane (Baysilon A ®)
L 11: terpolymer of ethylene glycol, propylene glycol and dimethyl siloxane (Tegopren 100 ®)
L 12: silicone oil ("AL")
L 13: undecanoic acid
L 14: copolymer of ethylene glycol and dimethyl siloxane (Nopco LA 111 ®)

EXAMPLES 1 TO 12 AND COMPARATIVE EXAMPLE C1

For Examples 1 through 12, the lubricants specified in Table I were added to the above-described positive-working coating. For comparative Example C1, no lubricant was added. The concentrations indicated refer to the solids content of the resulting reproduction layer.

EXAMPLES 13 TO 18 AND COMPARATIVE EXAMPLE C2

For Examples 13 through 18 only, the lubricant, which had been dissolved in white spirit, was coated onto a lubricant-free, positive-working reproduction layer (Table II).

EXAMPLES 19 TO 25 AND COMPARATIVE EXAMPLES C3 AND C4

For Examples 19 through 25 only, the lubricant, which had been dissolved in white spirit, was coated onto that surface of the original (having a base film of polyethylene glycol terephthalate), which carried the film assembly (Table III).

The reproduction layer comprised a positive-working layer in Examples 19 to 24 and in C3 and a negative-working layer in Example 25 and in C4.

What is claimed is:

1. A method for reducing halations in reproduction material suitable for preparing a printing plate which comprises a substrate and a radiation-sensitive reproduction layer applied to said substrate, said reproduction layer comprising a radiation-sensitive substance which is present in an amount sufficient to render said reproduction layer radiation-sensitive and which is selected from the group consisting of an o-quinone diazide, a diazonium salt condensation product and a combination of (1) a compound that, on being irradiated, splits off an acid and (2) a compound that possess at least one C—O—C group which can be split by acid, which method comprises the steps of (A) interposing a coating between said reproduction layer and an image original, said coating comprising at least one lubricant and having a coating weight in the range from 0.001 to 1%, based on the weight of said reproduction layer,
(B) imagewise irradiating said reproduction layer through said image original, said image original being in intimate contact with said reproduction layer during the imagewise irradiation, and then
(C) developing said reproduction layer by washing said reproduction layer in a developer solution to produce a surface in imagewise configuration which can be used for printing.

2. A method as claimed in claim 1, wherein said interposing step comprises (A) applying to said reproduction layer a composition comprising (i) said lubricant and (ii) a solvent or a dispersing agent, and (B) then removing said solvent or dispersing agent to form said coating on said reproduction layer.

3. A method as claimed in claim 1, wherein said interposing step comprises (A) applying to said image original a composition comprising (i) said lubricant and (ii) a solvent or a dispersing agent, and (B) then removing said solvent or dispersing agent to form said coating on said image original.

4. A method as claimed in claim 3, wherein said lubricant is present in said coating in an amount ranging from about 0.001% to 1% by weight, based on the weight of said image original.

5. A method as claimed in claim 1, wherein said lubricant comprises an organic polysiloxane, a hydrocarbon polymer, a polyaryl ester, an alkanoic acid or an alkenoic acid having at least 9 carbon atoms.

6. A method as claimed in claim 1, wherein said radiation-sensitive reproduction layer comprises an amount of o-quinone diazide sufficient to render said reproduction layer radiation-sensitive.

7. A method for reducing halations in reproduction material suitable for preparing a printing plate which comprises a substrate and a radiation-sensitive reproduction layer applied to said substrate, said reproduction layer comprising (i) a radiation-sensitive substance which is present in an amount sufficient to render said reproduction layer radiation-sensitive and which is selected from the group consisting of an o-quinone diazide, a diazonium salt condensation product and a combination of (1) a compound that, on being irradiated, splits off an acid and (2) a compound that possesses at least one C—O—C group which can be split by acid and (ii) from about 0.5% to 5% of at least one lubricant selected from the group consisting of a dimethyl siloxane homopolymer, a polysiloxane-free hydrocarbon polymer and a polyaryl ester, which method comprises the steps of (A) imagewise irradiating said reproduction layer through said image original, said image original being in intimate contact with said reproduction layer during the imagewise irradiation, and then
(B) developing said reproduction layer by washing said reproduction layer in a developer solution to produce a surface in imagewise configuration which can be used for printing.

8. A method as claimed in claim 7, wherein said lubricant is free of silicone oil.

* * * * *

UNITED STATES PATENT AND TRADEMARK OFFICE
CERTIFICATE OF CORRECTION

PATENT NO. : 4,725,526
DATED : February 16, 1988
INVENTOR(S) : FRASS et al.

It is certified that error appears in the above—identified patent and that said Letters Patent is hereby corrected as shown below: Title page:

[73] Assignee: "Hoeschst" Aktiengesellschaft should be --Hoechst-- Aktiengesellschaft Signed and Sealed this Twenty-ninth Day of November, 1988

Attest:

DONALD J. QUIGG

Attesting Officer

Commissioner of Patents and Trademarks